United States Patent [19]

Whitney

[11] Patent Number: 4,557,549

[45] Date of Patent: Dec. 10, 1985

[54] CONNECTOR DEVICE

[75] Inventor: Daniel E. Whitney, Arlington, Mass.

[73] Assignee: The Charles Stark Draper Laboratory, Inc., Cambridge, Mass.

[21] Appl. No.: 164,837

[22] Filed: Jun. 30, 1980

[51] Int. Cl.$^4$ ............................................. H01R 13/10
[52] U.S. Cl. ................................................ 339/258 R
[58] Field of Search ............ 339/17 CF, 65, 66, 258 R

[56] References Cited

U.S. PATENT DOCUMENTS 4,090,772  5/1978  Goodman ........................ 339/258 R

FOREIGN PATENT DOCUMENTS 2233935  1/1974  Fed. Rep. of Germany ... 339/17 CF
1152765  5/1969  United Kingdom ........... 339/17 CF Primary Examiner—Joseph H. McGlynn
Attorney, Agent, or Firm—Joseph S. Iandiorio; William E. Noonan

[57] ABSTRACT

A connector device including plug and socket components, one of the components being an elastic engagement element of length L and the other of the components including a chamfered surface including: a nose portion having a first slope; a root portion having a second positive slope; and a convex fair curve interconnecting the nose and root portions.

2 Claims, 10 Drawing Figures

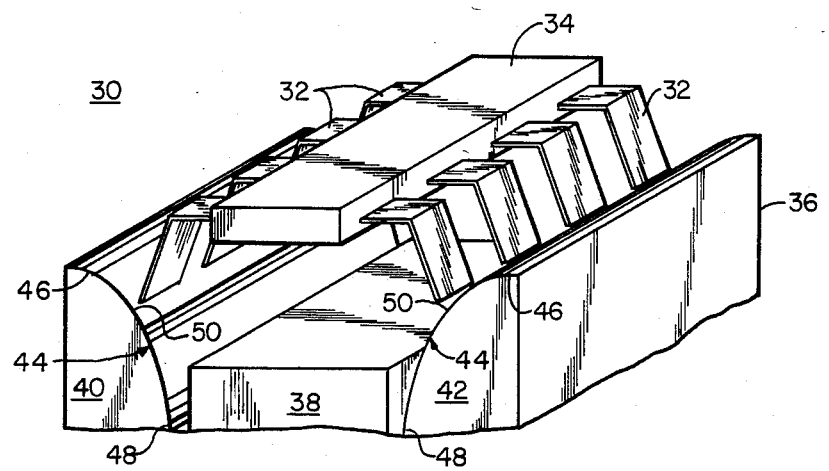
Fig. 2
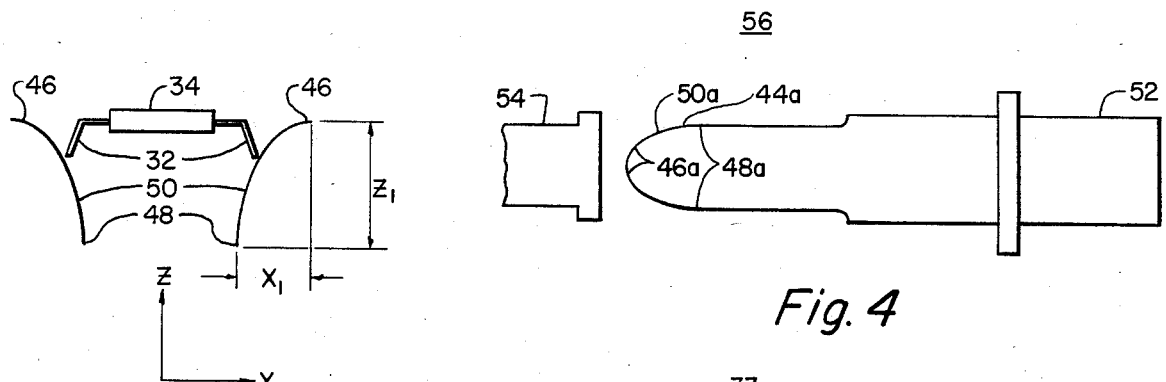
Fig. 4
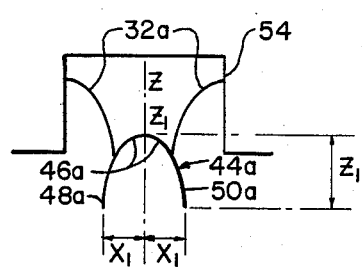
Fig. 3
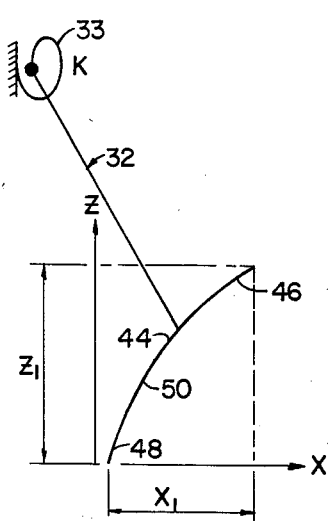
Fig. 5
Fig. 6

CONNECTOR DEVICE

FIELD OF INVENTION

This invention relates to a connector device having a minimum peak insertion force.

BACKGROUND OF INVENTION

Low insertion force is a widely sought goal in connection devices. Integrated circuit (IC) chips are made by a number of manufacturers and the standards for typical IC housings such as dual in-line packages (DIP's) are not rigid. Normally IC DIP's have contact legs which splay outward and must be captured and straightened as they are guided into engagement with the socket by man or machine by means of the lead-in surfaces or chamfers. Most such chamfer surfaces are straight and do little to reduce mating force. Techniques such as lubrication, forming the DIP's with straight legs, and using a mechanism to clamp the legs, often add significantly to the cost of the DIP and DIP sockets and do not always significantly reduce insertion force.

In other situations, too, reduction of insertion force is desirable: plug and socket and pin and jack. One approach in this area is disclosed in U.S. Pat. No. 4,090,772, with respect to a pin and socket of circular cross section in which the pin and socket size and shape are constrained to a limited region and the surface finish carefully controlled.

When high peak forces of insertion are encountered the device must be "overdesigned" in order to accommodate that peak force, even though that peak force may be only momentary and force during the rest of the insertion is much lower than the peak force.

SUMMARY OF INVENTION

It is therefore an object of this invention to provide an improved connector device including a socket having a chamfered surface for minimizing peak insertion force.

It is a further object of this invention to provide a connector device of optimal chamfer for any size and shape of pin, socket, elastic engagement element, and coefficient of friction.

It is a further object of this invention to provide a connector device having a predictable magnitude of minimum peak insertion force.

It is a further object of this invention to provide a connector device with a simple, practical chamfer which operates with minimum insertion force.

This invention features a connector device including plug and socket components. One of the components is an elastic engagement element of length L and the other of the components includes a chamfered surface. The chamfered surface includes a nose portion having a first slope; a root portion having a second positive slope; and a convex fair curve interconnecting the nose and root portions.

A chamfered surface may be described as having a length $Z_1$ along its longitudinal axis, a width $X_1$ along its lateral axis, and a coefficient of friction $\mu$. According to this invention, the first positive slope value is $$\frac{\mu + X_1/L}{1 - X_1/L}$$

The optimum second positive slope value is $RZ_1/X_1$, where R is determined by expression (7) in the specification. The convex fair curve is defined by $$Z = -X/\mu + \frac{C(1 + \mu^2)}{K\mu^2(1 - C/KL)} \ln\left[\frac{\mu(X_1 - X) - C(1 - \mu X/L)/K}{\mu X_1 - C/K}\right]$$

In one specific embodiment the connector device includes a DIP socket and a DIP which has an elastic contact element of length L. The DIP socket has a chamfered surface that includes a nose portion having a first positive slope, a root portion having a second positive slope, and a convex fair curve interconnecting the nose and root portion.

DISCLOSURE OF PREFERRED EMBODIMENT

Other objects, features and advantages will occur from the following description of a preferred embodiment and the accompanying drawings, in which:

FIG. 2 is an axonometric view of a portion of a dual in-line package and dual in-line package socket about to be engaged with each other, having chamfered surfaces according to this invention;

FIG. 3 is a schematic view of the dual in-line package and socket of FIG. 1;

FIG. 4 is a side elevational view of a pin having chamfered surfaces according to this invention and a jack for receiving the pin;

FIG. 5 is a schematic view of the pin and jack of FIG. 4;

FIG. 6 is a graphical representation of the parameters that are considered in constructing the chamfer surface according to this invention;

The invention may be accomplished in any conventional connector device having mating male and female plug and socket components. For example, a dual in-line package (DIP) may have its flexible legs engaged with a DIP socket, which bears the optimal chamfer surface according to this invention.

The chamfered surface is optimized for various combinations of the coefficient of friction $\mu$, the length along the longitudinal axis $Z_1$, and the width along the lateral axis $X_1$, and the length of the engagement element L, so that the peak insertion force is kept to a minimum.

Figure 1:
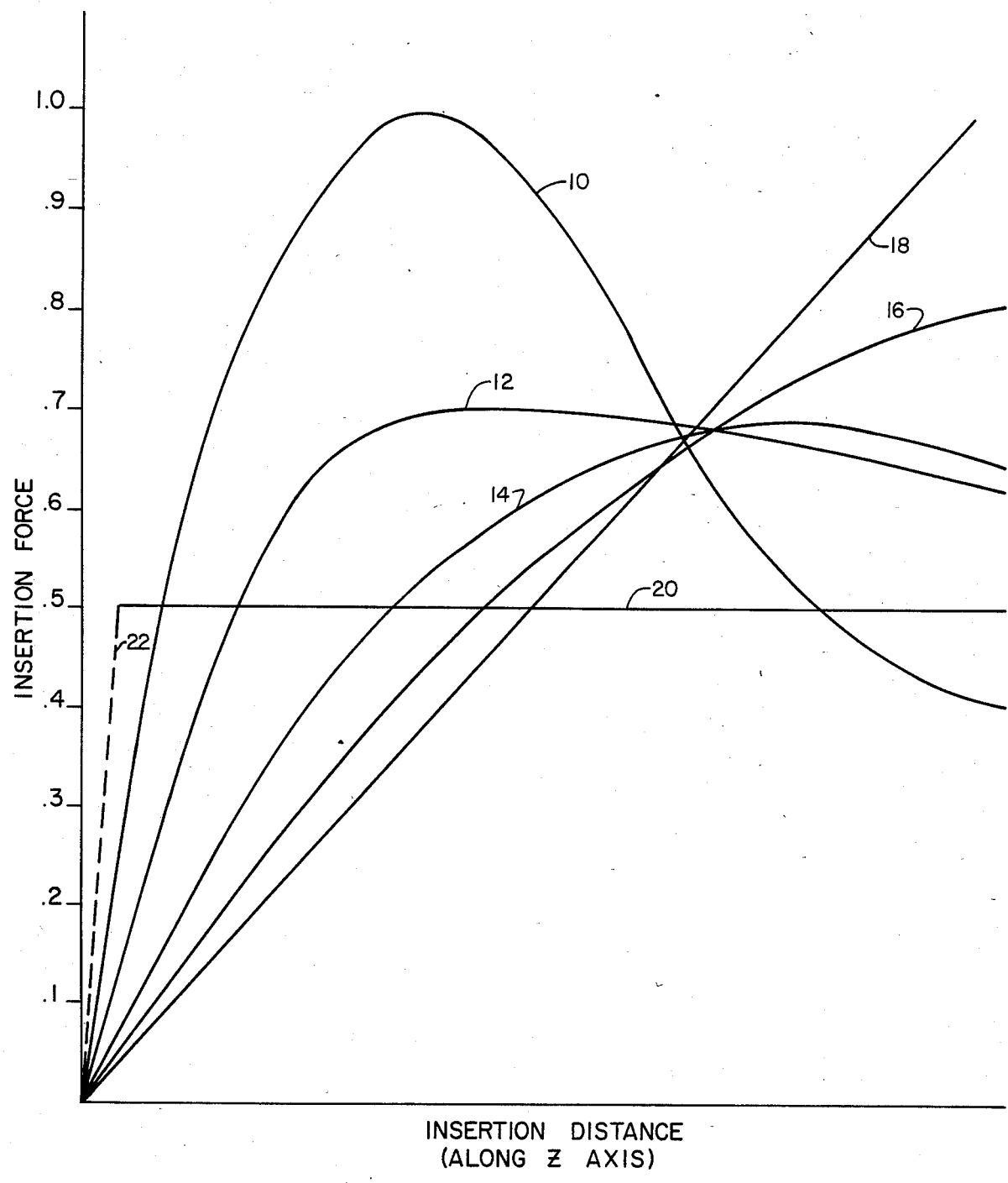
FIG. 1 is an idealized graphical illustration of the characteristic of force with respect to distance as the connector device plug and socket mate in this invention and in certain prior art devices.

For example, as shown in FIG. 1, the insertion force pattern varies greatly when plotted against the insertion distance, depending upon the particular characteristics of the plug and socket connector devices. For example, curve 10 indicates a very high initial peak force, designated as 1.0, that then trails off as insertion is completed to a very low force of approximately 0.4. Curve 12 has a much lower peak force in the neighborhood of 0.7, but that peak force is maintained for much longer with respect to curve 10 and it tapers off more gradually to approximately the same level. Curve 14 shows an even lower peak insertion force, which is also more constant. Curve 16 shows yet another behavior pattern, in which the insertion force increases quickly and then increases more slowly, but always increases. Finally, curve 18 is a straight line with a slope of approximately one, so that the force is constantly increasing during insertion.

It has been determined by the inventor that theoretically the peak force could be minimized at a level of approximately 0.5. The resulting theoretical insertion force, 20 in FIG. 1, is constant from the beginning to the completion of the insertion, with the exception that at the very beginning there is some uncertainty as to exactly how fast the force climbs in the area indicated at 22. It has been actually determined that the peak force can be minimized at an approximately constant level slightly above 0.5 with the force rising gradually at the beginning.

The invention may be accomplished, for example, with a connector device 30, FIG. 2, including elastic or flexible contact leads 32 of dual in-line package (DIP) 34, which engage with a DIP socket 36, formed in the conventional way with a pad 38 and two shoulders 40, 42, each of which bears a chamfered surface 44 according to this invention. Each chamfered surface 44 includes an upper or nose portion 46 having a positive slope; a lower root portion 48 having a positive slope; and a convex fair curve 50 interconnecting those portions. As shown in FIG. 3, each of the surfaces 44 has a lateral width $X_1$ and a longitudinal length $Z_1$. Surface 44 may also be applied as a surface of revolution, for example, as shown in FIG. 4 where chamfered surface 44a is carried on a pin 52, which in combination with jack 54 constitutes connector device 56. Surface 44a is shown in more detail in schematic form in FIG. 5, where it can be seen that the two nose portions 46a merge at the top while the root portion 48a occurs about the surface of the generally cylindrical pin 52 as does the fair curve 50a which interconnects the nose and root portions. The engaging portion of jack 54 includes flexible engagement elements 32a.

As shown in FIG. 6, the chamfer surface 44 according to this invention is related to the longitudinal axis length $Z_1$, the width $X_1$, the length L of the elastic engaging element 32, and the coefficient of friction $\mu$ between the chamfer and the engagement element. That the optimum chamfered surface for optimizing (minimizing) insertion force includes positive nose and root slopes interconnected by a convex fair curve can be seen by the following technique.

Select values $X_1$ and $Z_1$ and define their ratio as S:

$$S = Z_1/X_1 \tag{1}$$

Generally, larger values of S give lower values of mating force. The inventor has found that values of S between 3 and 5 are typically good values. Values of S less than 3 yield short chamfers with high constant mating force. Values of S larger than 5 do not yield much improvement in mating force while yielding large chamfers.

Determine the friction coefficient $\mu$ which governs sliding behavior between the engagement element and the chamfer.

Figure 7:
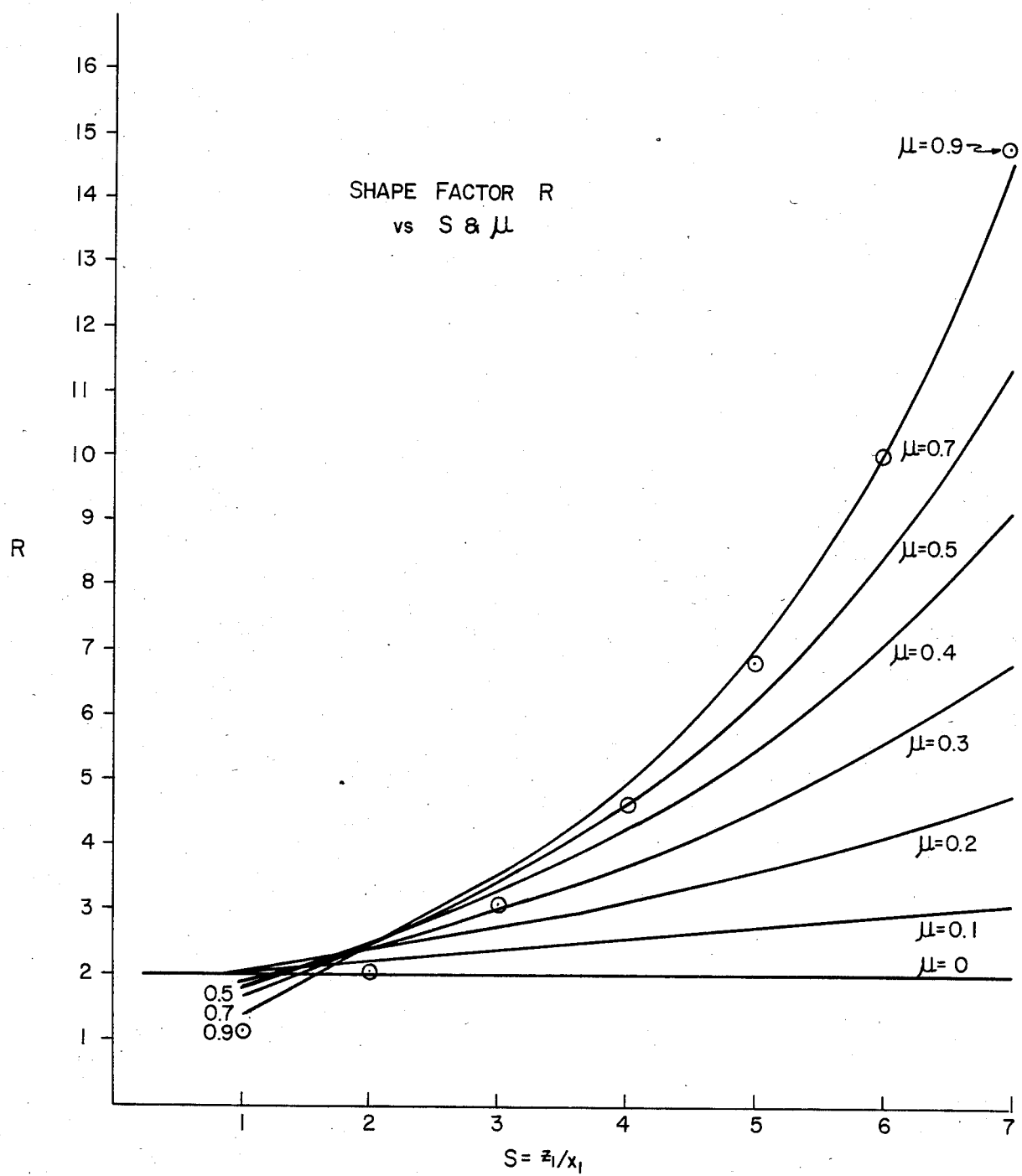
FIG. 7 is a group of curves which may be generated by a computer to be used in constructing the chamfer surface according to this invention.

Determine the value of R defined for the given S and $\mu$ by the curves shown in FIG. 7.

The curves in FIG. 7 are obtained from the exact theoretical shape for the chamfer as follows. The theoretical optimum shape is $$Z = -X/\mu + \frac{C(1 + \mu^2)}{K\mu^2(1 - C/KL)} \ln\left[\frac{\mu(X_1 - X) - C(1 - \mu X/L)/K}{\mu X_1 - C/K}\right] \tag{2}$$

where
C = the minimum mating force
K = the lateral stiffness of the engaging member 32, as represented schematically by spring 33 in FIG. 4.

The slope of the top or nose portion 46 of the chamfer is given by $$Z'(X_1) = \frac{\mu + X_1/L}{1 - \mu X_1/L} \tag{3}$$

and the slope of the bottom or root portion 48 of the chamfer is given by:

$$Z'(0) = \frac{X_1 + C\mu/K}{C/K - \mu X_1} \tag{4}$$

A new variable R is defined as:

$$RS = Z'(0) \tag{5}$$

Then (5) and (1) can be used in (4) to solve for the minimum mating force C as $$C = KX_1 \frac{\mu RS + 1}{RS - \mu} \tag{6}$$

Then (6) and (1) are used to eliminate C/K from (2) to yield:

$$\frac{\mu(\mu S + 1)}{(1 + \mu^2)}\left[\frac{RS - \mu}{\mu RS + 1} - \frac{X_1}{L}\right] = \ln\left[\frac{\mu RS + 1}{1 + \mu^2}(1 - \mu X_1/L)\right] \tag{7}$$

This equation has been solved by computer techniques to obtain the more convenient curves in FIG. 7.

The theoretically exact optimum or minimum force chamfer is obtained by using equation (2) to plot the shape or to create commands to numerical control or other machines in the customary way.

A much simpler approach for obtaining a very close approximation to the minimum force chamfer proceeds as follows.

At the root of the chamfer construct a line of slope $Z'(0)$;

$$Z'(0) = RS \tag{8}$$

using the values of R and S determined in steps 1, 2, and 3.

At the top of the chamfer construct a line of slope $Z'(X_1)$:

$$Z'(X_1) = \frac{\mu + X_1/L}{1 - \mu X_1/L} \qquad (9)$$

Using a French curve or other drafting aid, draw a fair curve between the root and the nose which curve is tangent at the root to the line constructed in (8) and tangent at the nose to the line constructed in (9). The tip of the nose may be rounded slightly without impairing the optimal behavior of the chamfer as a whole. Also, if the values of L and $\mu$ are known only approximately, average values can be used without seriously impairing the optimal behavior. A conservative design may be based on the largest $\mu$ and the smallest L which are likely to be encountered.

Figure 8A:
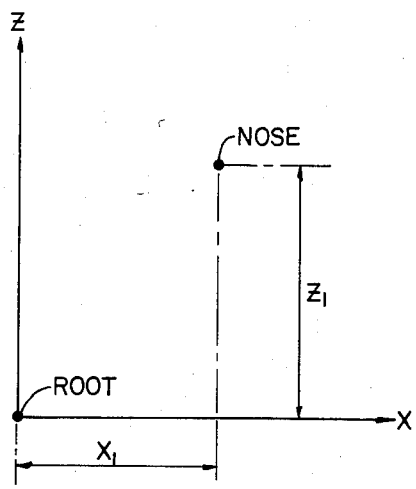
FIGS. 8A, B, and C depict the nose and root positions being specified; the construction of the nose and root slopes; and the use of a French curve to contruct the fair curve, respectively.
Figure 8B:
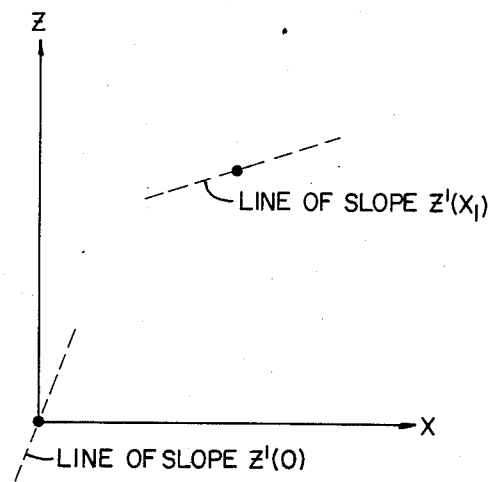
Figure 8C:
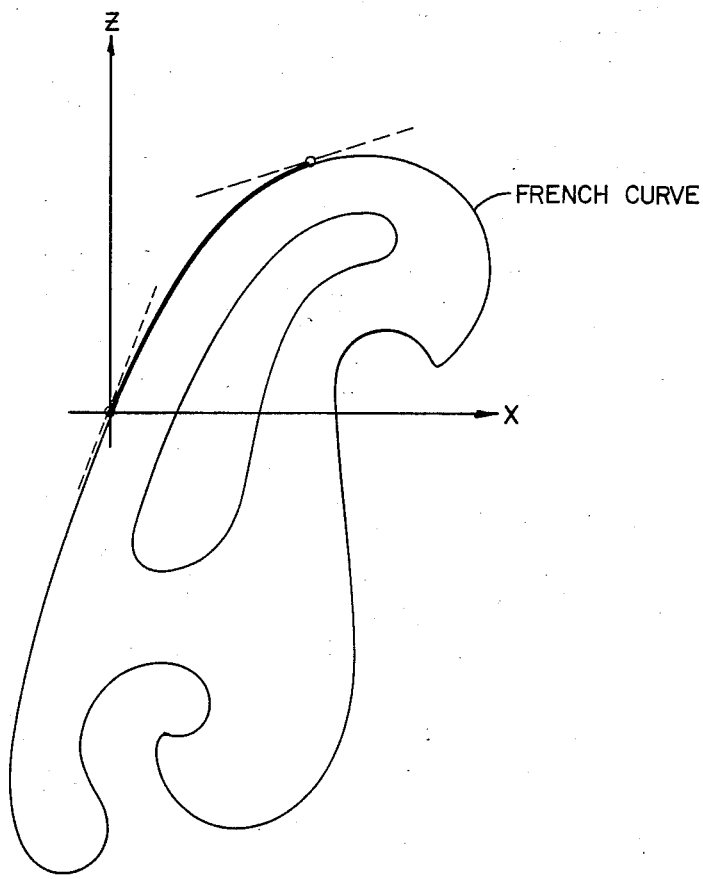

The procedure is illustrated schematically in FIGS. 8A, B, and C.

Other embodiments will occur to those skilled in the art and are within the following claims:

What is claimed is:

1. A connector device including plug and socket components, one of the components being an elastic engagement element of length L and the other of said components including a chamfered surface, comprising:

a nose portion having a first positive slope of $$\frac{\mu + X_1/L}{1 - \mu X_1/L};$$

a root portion having a second positive slope $RZ_1/X_1$, where R is determined by $$\frac{\mu(\mu S + 1)}{(1 + \mu^2)} \left[ \frac{RS - \mu}{\mu RS + 1} - \frac{X_1}{L} \right] =$$

$$\ln\left[ \frac{\mu RS + 1}{1 + \mu^2} (1 - \mu X_1/L) \right];$$

and
a convex fair curve defined as $$Z = -X/\mu +$$

$$\frac{C(1 + \mu^2)}{K\mu^2(1 - C/KL)} \ln\left[ \frac{\mu(X_1 - X) - C(1 - \mu X/L)/K}{\mu X_1 - C/K} \right]$$

interconnecting said nose and root portions.

2. A connector device including a socket component including a socket component including a chamfered surface for engaging with a plug component having an elastic engagement element of length L, comprising:

a nose portion having a first positive slope of $$\frac{t X_1 L}{1 - X_1 L}$$

a root portion having a second positive slope; and a convex fair curve interconnecting said nose and root portions, in which the said convex fair curve is $$-X/- + \frac{C(1 + 2)}{K^2(1 - C/KL)} en\left[ \frac{(X_* - X) - C(1 - X/L)}{X_* - C/K} \right]$$

where said chamfered surface has a length Z, along its longitudinal axis, a width X, along its lateral axis, and a coefficient of friction.

* * * * *